United States Patent [19]

Tigelaar et al.

[11] Patent Number: 5,410,162

[45] Date of Patent: Apr. 25, 1995

[54] APPARATUS FOR AND METHOD OF RAPID TESTING OF SEMICONDUCTOR COMPONENTS AT ELEVATED TEMPERATURE

[75] Inventors: Howard L. Tigelaar, Allen; Mehrdad M. Moslehi, Dallas, both of Tex.

[73] Assignee: Texas Instruments Incorporated, Dallas, Tex.

[21] Appl. No.: 137,662

[22] Filed: Oct. 15, 1993

[51] Int. Cl.$^6$ .................... H01R 13/64; G01N 3/26
[52] U.S. Cl. .................... 257/48; 257/923; 324/765; 374/57; 29/593; 437/248; 148/DIG. 162
[58] Field of Search .................... 257/48, 913; 324/765; 374/57; 29/593; 437/247, 248, 942; 248/DIG. 4, DIG. 162

[56] References Cited

U.S. PATENT DOCUMENTS

| | | | |
|---|---|---|---|
| 4,567,432 | 1/1986 | Buol et al. | 324/158 |
| 4,818,327 | 4/1989 | Davis et al. | 156/345 |
| 4,830,700 | 5/1989 | Davis et al. | 156/345 |
| 4,832,779 | 5/1989 | Fisher et al. | 156/345 |
| 4,879,259 | 11/1989 | Reynolds et al. | 437/22 |
| 4,891,499 | 1/1990 | Moslehi | 219/502 |
| 5,318,361 | 6/1994 | Chase et al. | 374/57 |

*Primary Examiner*—J. Carroll
*Attorney, Agent, or Firm*—Kay Houston; Richard A. Stoltz; Richard L. Donaldson

[57] ABSTRACT

An apparatus and method for rapidly changing the temperature of a semiconductor wafer, in order to perform electrical tests or stress at elevated temperature, and then cool rapidly to ambient temperature. The apparatus is comprised of a wafer support 17, capable of supporting the wafer, mounted on top of a rapid thermal processing (RTP) illuminator 20 (lamps, preferably halogen), and including one or more probe needles 22, capable of contacting the wafer to perform electrical measurements. A semiconductor wafer 16 is placed upon the wafer support 17 and the RTP illuminator 20 located beneath is activated, rapidly elevating the wafer to the desired temperature. Electrical tests may be performed as desired during the process.

17 Claims, 3 Drawing Sheets

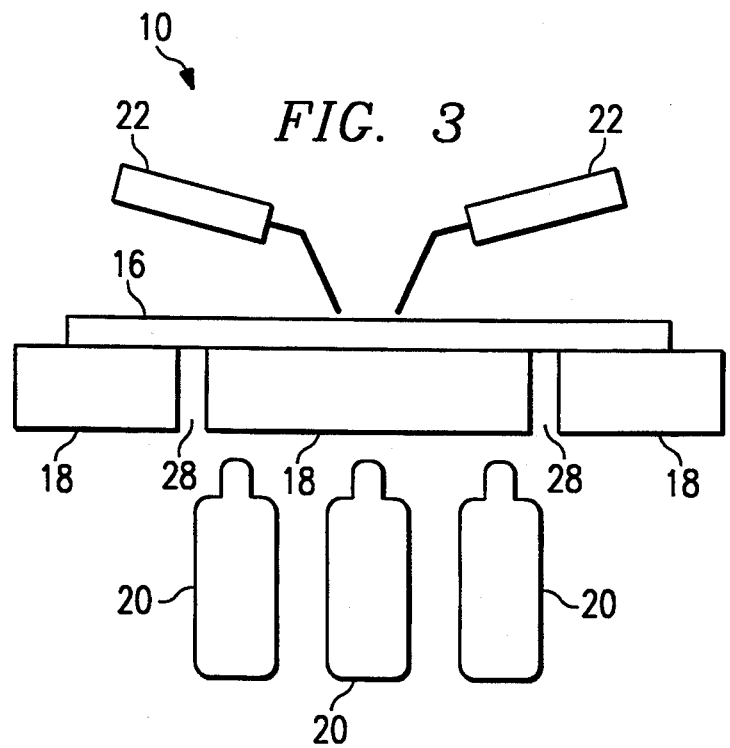
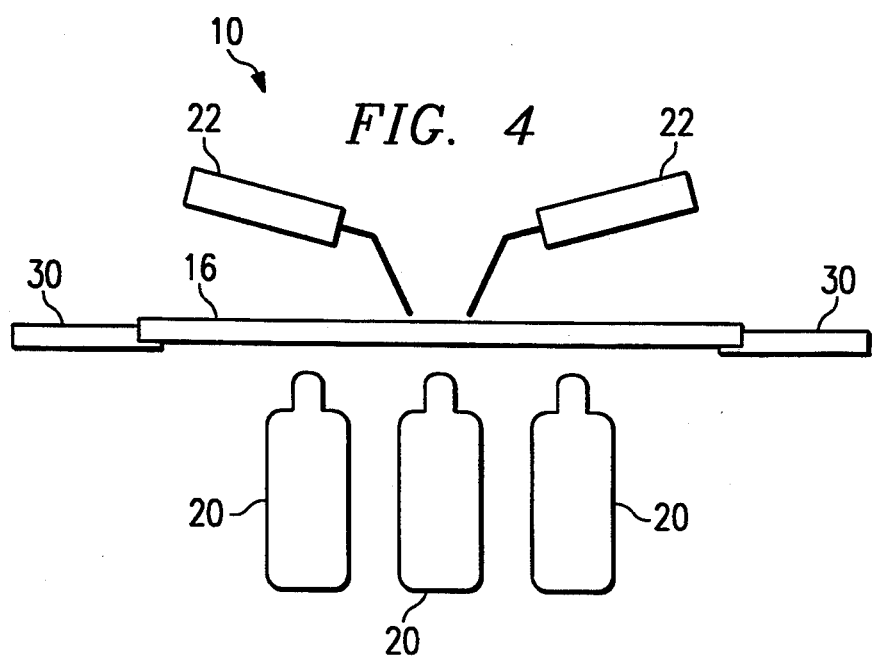

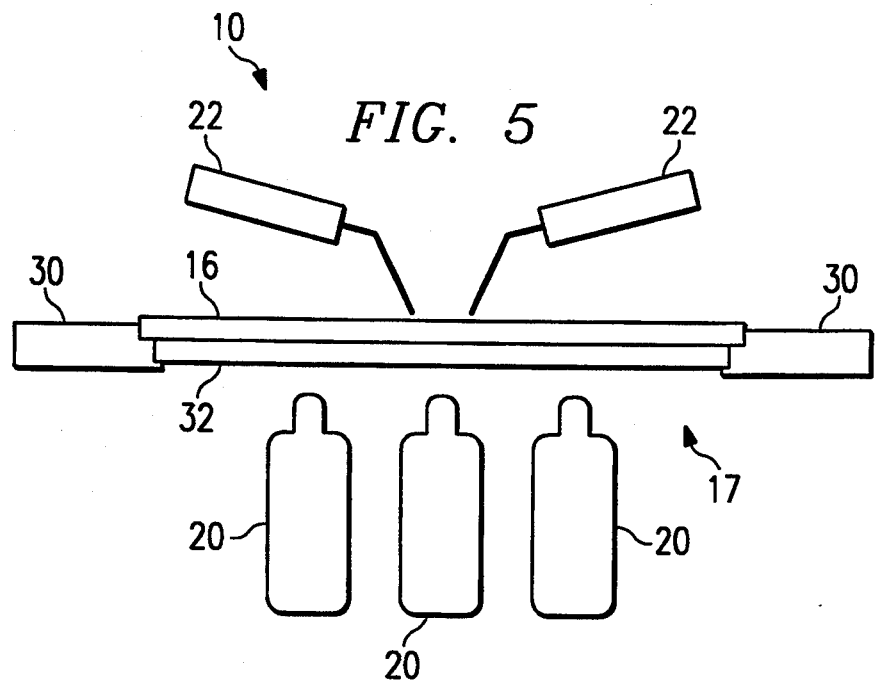
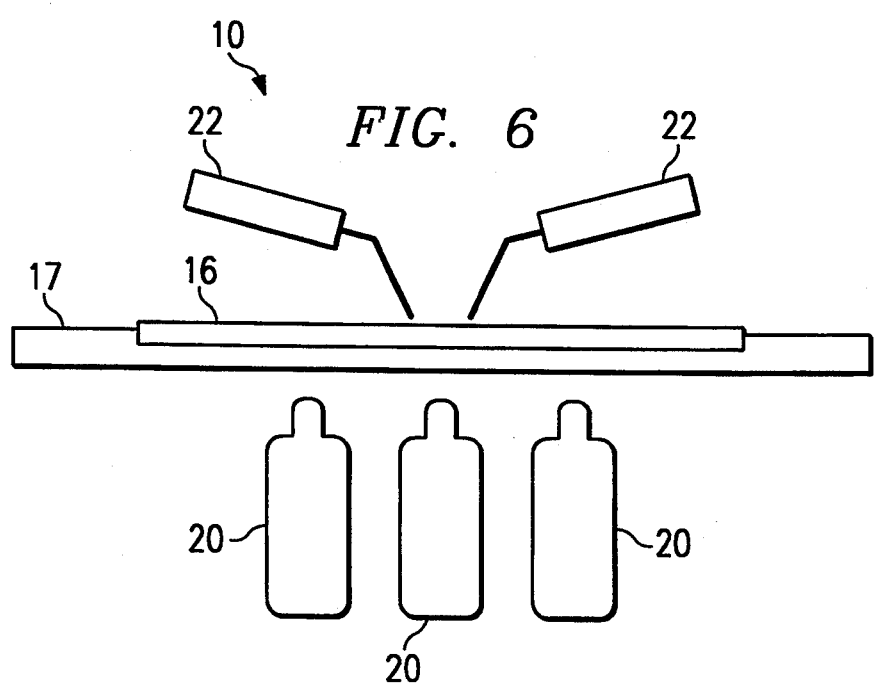

APPARATUS FOR AND METHOD OF RAPID TESTING OF SEMICONDUCTOR COMPONENTS AT ELEVATED TEMPERATURE

CROSS-REFERENCES TO RELATED APPLICATIONS

Ser. No. 815,653, entitled *Conditioning of Semiconductor wafers for Uniform and Repeatable Rapid Thermal Processing*, (Texas Instruments case number T-16323), filed on Dec. 31, 1991 by Moslehi et al.

BACKGROUND OF THE INVENTION

Field of the Invention

The invention relates generally to semiconductor device electrical testing and more particularly to apparatus for performing electrical testing on semiconductor devices at various temperatures including elevated temperatures in wafer form.

In semiconductor technology, electronic devices and circuits are made on one semiconductor wafer. They each have various components on them; these components may include transistors, resistors, capacitors, and others. After the circuit has been fabricated, individual components or circuit modules in selected circuits can be probe tested to determine the electrical characteristics of the various components. In the development phase of semiconductors, characteristic tests over a wide temperature range are typically performed in order to test device reliability and performance under temperature stress. Other temperature-dependant tests are performed during production in order to monitor the quantities or presence of certain elements such as mobile ion contaminants that may be introduced during the processing of the material.

Pat. No. 4,567,432 entitled "Apparatus for Testing Integrated Circuits" filed on Jun. 9, 1983 by Buol et al describes a system for testing an integrated circuit die in wafer form at various temperatures. The system involves a resistively-heated wafer chuck which includes a means for heating and/or cooling the wafer via an electrical heating element and refrigerant gas.

While nothing in prior art suggests or teaches the use of a Rapid Thermal Processing chuck or susceptor for probe testing of semiconductors, or the use of such a chuck in or with a probed test fixture, several patents have been issued for the production of semiconductors using Rapid. Thermal Processing. One such patent is U.S. Pat. No. 4,891,499 filed Sep. 9, 1988 by Moslehi, entitled "Method and Apparatus for Real-time Wafer Temperature Uniformity Control and Slip-Free Heating on Lamp Heated Single-wafer Rapid Thermal Processing Systems". Another such patent is U.S. Pat. No. 4,830,700 filed Apr. 27, 1988 by Davis et al entitled "Processing Apparatus and Method" wherein the processing apparatus also utilizes Rapid Thermal Processing. In these Rapid Thermal Processing (RTP) patents the semiconductor wafer is placed either device side down or device side up in a vacuum or atmospheric chamber prior to the processing stages at relatively high temperatures.

BRIEF DESCRIPTION OF THE DRAWINGS

The present invention will be described with reference to the accompanying drawings, wherein:

FIGS. 3 (through 6 show other embodiments.

SUMMARY OF THE INVENTION

Figure 1:
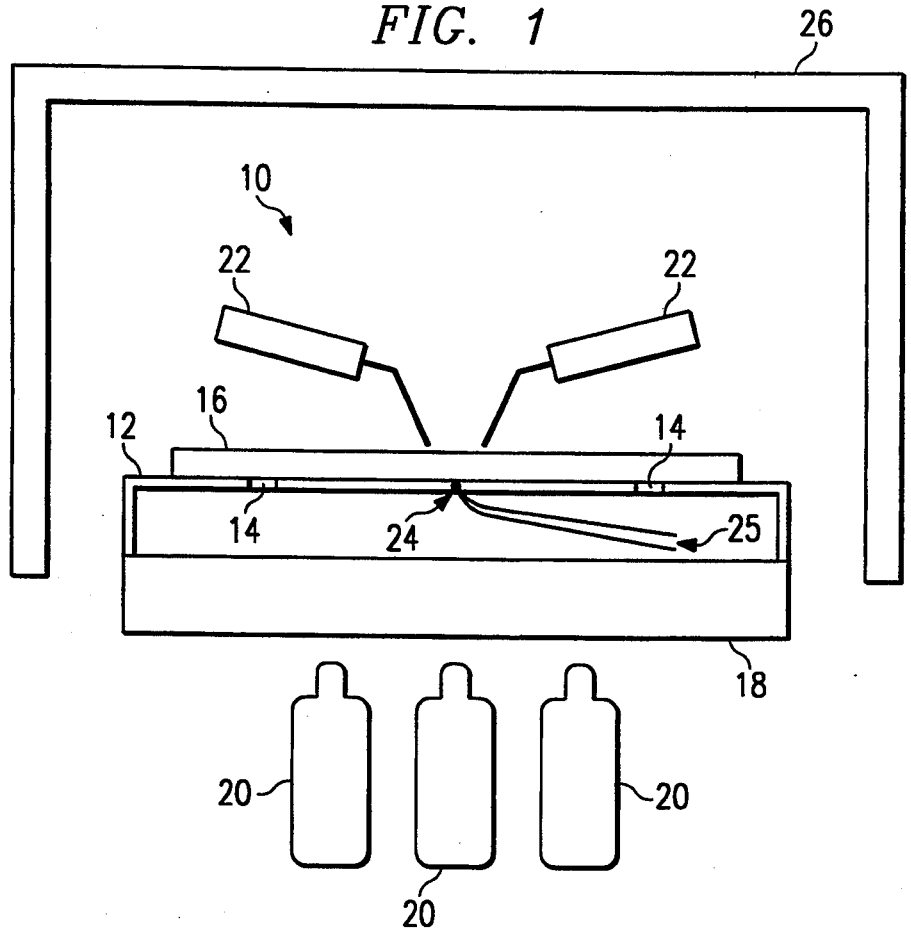
FIGS. 1 and 2 each show an elevation of a preferred embodiment.
Figure 2:
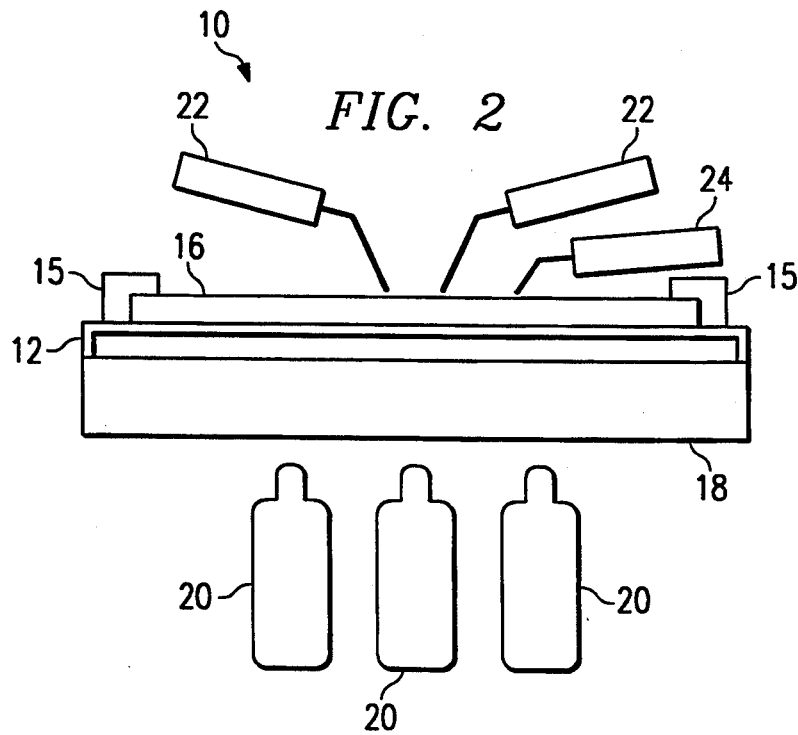

In the past, probe stations have utilized high thermal mass resistance heated metal chucks with water coolant to expedite the cooling process. These chucks were rather massive and time-consuming to use. Past chucks were of a thick gauge of metal (at least ½"), and thus required a large amount of time to heat and cool (e.g. approximately half an hour for the cycle). When a semiconductor wafer underwent electrical tests at elevated temperatures, the wafer, chuck and probe were raised to an elevated temperature in order for the tests to be conducted. With resistance heating, a relatively massive chuck is required to obtain uniform heating. The testing time at elevated temperatures is quite long because of the time it takes to heat and cool the high thermal mass resistively heated chuck.

This new invention allows for much more rapid changes in temperature of the wafer than with prior test systems, with very stable results and robust temperature control. The apparatus includes a wafer support, a rapid thermal processing (RTP) illuminator (that is used to heat the wafer), and electrical probe needles to contact the wafer. The RTP illuminator consists of lamps, preferably tungsten-halogen bulbs, and is capable of heating the susceptor and the wafer quite rapidly and uniformly.

In one embodiment, the wafer support is a ting with a hole in the center. In another embodiment, the ring has a center portion that is transparent (e.g. made of quartz) immediately underneath the wafer. One embodiment involves an opaque and optically absorbing wafer support that is thermally conductive with a low thermal mass. In yet another embodiment, the wafer support is a transparent window, made of a material such as quartz that is generally transparent to the light from the heating lamps. Another version involves a thin gauge (about 1/16") low-thermal mass conductive susceptor to support the wafer, which is mounted on a transparent window, thermally insulating the wafer frown the window. The wafer can be held into place on the susceptor or transparent window by either a vacuum, clamps or other mechanism.

These embodiments provide electrical probe test fixtures that generally have a wafer support either having low thermal conductivity to the wafer or low thermal mass, or both, and can reduce testing time up to tenfold over the past chucks, particularly for electrical tests at more than one temperature between room temperature and one or more elevated wafer temperatures.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts where the rapid heating and cooling of low thermal mass objects is desirable. The specific embodiments discussed are merely illustrative of specific ways to make and use the invention, and do not delimit the scope of the invention.

The following is a description of a preferred embodiment followed by a method of using the invention. Other versions of the apparatus will then be described, followed by some suggested alternate components. Corresponding numerals and symbols in the different figures refer to corresponding parts unless otherwise indicated. Table 1 below provides an overview of the elements of the embodiments and the drawings.

TABLE 1

| Drawing Element | Preferred or Specific Examples | Generic Term | Other Alternate Examples |
| --- | --- | --- | --- |
| 10 | n/a | Apparatus | n/a |
| 12 | Black Anodized Aluminum, 1/16" thick | Susceptor | MONEL, graphite, silicon carbide, or any metal with low thermal mass (e.g. no greater than ¼" thickness). |
| 14 | Holes in susceptor | Holding means | Clamps, electrostatic, or other mechanisms to hold the wafer in place, e.g. vaccuum clamp. |
| 15 | Clamps | Holding means | Holes, electrostatic. |
| 16 | n/a | Semiconductor wafer | n/a |
| 17 | Aluminum or a transparent window | Wafer Support | Metal, silicon carbide, silicon, graphite, or any other supportive material that would withstand the testing temperature (e.g. ceramic or metal). |
| 18 | Quartz | Transparent window | Sapphire, glass or other transparent material. |
| 20 | Tungsten Halogen Lamp | Rapid Thermal Processing (RTP) illuminator | Other radiant lamps or bulbs such as plasma arc lamp or any blackbody heater. |
| 22 | n/a | Probe needles | n/a |
| 24 | n/a | Thermocouple | n/a |
| 25 | n/a | Wires | n/a |
| 26 | n/a | Cover | n/a |
| 28 | Holes in window | Holding means | Clamps, electrostatic, or other mechanisms to hold the wafer in place. |
| 30 | Aluminum | Ring | Metal, silicon carbide, graphite or any other supportive material that would withstand the testing temperature. |
| 32 | Quartz or Aluminum | Center Portion of Ring | Metals or any material that is either transparent or thermally conductive. |

In semiconductor wafer fabrication, it is, for example, important to periodically monitor furnace tubes and metal deposition equipment for mobile ions (e.g. Na or K), which are a contaminant. If an excessive level of mobile ions are present, production must be halted until the source of contamination is eliminated in the production equipment. A test called Fast Bias Temperature Stress is a measure of the amount of mobile ions present on the wafer. Throughout the industry, this test is run on a periodic basis, generally at least daily.

Currently, when a semiconductor wafer is undergoing Fast Bias Temperature Stress test a CV (Capacitance/Voltage) reference curve is first taken on a test capacitor at room temperature. The entire wafer and probe is then raised to 250 degrees C. Next, an electrical signal is applied to the capacitor on the wafer under test, the measurement for Fast Bias Temperature Stress is begun, and then the system is cooled back down again with the voltage applied. Finally, a second CV curve is taken and compared to the first CV curve. The magnitude of the shift in the curve under high-temperature electric field stress is proportional to the concentration of mobile ions present in the device under test. This cycle of heating, testing and cooling has previously taken 20 to 30 minutes.

The Fast Bias Temperature Stress test is initialized at 250 degrees C., in order for the mobile ions to move within the gate oxide. However, this temperature is actually only necessary for a short time (e.g. a millisecond); the remainder of time is spent heating and cooling the probe station due to the large thermal mass of the chuck.

FIG. 1 shows a preferred embodiment of the apparatus 10, comprised of a thin-gauge low-thermal mass conductive (such as thin black anodized aluminum) susceptor 12, which can have holes 14 in it so a vacuum can be applied under the susceptor 12 (thus holding the semiconductor wafer 16, in place). The susceptor 12 is mounted on top of a transparent window 18, and is comprised of a material such as quartz that generally is transparent to the tungsten-halogen light. Beneath the susceptor are several heating bulbs forming the RTP illuminator 20. In this embodiment, the susceptor 12 thermally insulates and separates the wafer 16 from the transparent window 18.

Also included are electrical probe needles 22, which come into contact with the top surface of the wafer for electrical measurements. There is relative movement, both horizontally and vertically, between the probe needles and the wafer allowing contacts to be made to various device electrodes. A thermocouple 24 is located near the center of the susceptor which is connected to an instrument for temperature measurement and closed-loop control (not shown). A probe station cover 26 can be placed on top of the entire assembly while the wafer is undergoing tests. In this embodiment, the semiconductor wafer is preferably mounted face-up and is bottom-illuminated.

To test for Fast Bias Temperature Stress utilizing the apparatus, first the probe needles are moved to the particular circuit to be tested on the wafer. Next, the RTP illuminator is used to rapidly (e.g. in 20 seconds or less) elevate the temperature of the wafer to 250 degrees C. (or any other desired elevated temperature) and held at that temperature for approximately 30 seconds. A voltage is then applied through the probes to the particular component (e.g. a capacitor) of interest. The apparatus and wafer are allowed to cool in ambient temperature with the voltage applied, and the capacitance is measured and recorded after the wafer cools.

There are many other temperature-dependent phenomena that can be tested with the apparatus, such as diode leakage, current drive, and other activation energy measurements and characterizations. These types of tests are used frequently for reliability measurements and characterization of a semiconductor wafer.

FIGS. 2 through 6 illustrate alternate versions of the apparatus. FIG. 2 again shows the apparatus 10, upon which the wafer 16 is mounted face-up on top of the low thermal mass susceptor 12 without vacuum, and with clamps 15 to hold the wafer in place. Probe needles 22 and thermocouple 24 are positioned over semiconductor wafer 16.

In FIG. 3, the apparatus 10 is another alternative, with the wafer 16 mounted directly on a wafer support 17 (which in this case is a transparent window 18), under which the RTP illuminator 20 is located. The window is shown with holes 28 in it, so a vacuum may be applied in order to hold the wafer in place. Probe needles 22 contact the wafer from the top side.

FIG. 4 shows the apparatus 10 comprised of a wafer support 17 (which in this case is a ring 30 which holds wafer 16). The RTP illuminator 20 and probe needles 22 are located below and above the wafer support, respectively. FIG. 5 shows a similar apparatus 10 in which the wafer support 17 is a ring 30 with a center portion 32 directly underneath the wafer, which can be made of a transparent material. The wafer 16 is placed on the center portion 32 of the ring 30. Again, the RTP illuminator 20 and probe needles 22 are located below and above the wafer support, respectively.

FIG. 6 shows the apparatus 10 in which the wafer support 17, made of a low-thermal mass thermally conductive material, braces the wafer 16. The RTP illuminator 20 and probe needles 22 again are located below and above the support, respectively.

There are other alternatives available for the components of the system. Rather than holes and a vacuum to hold the wafer in place, mechanical clamps or other devices could be used to hold the wafer in place. The transparent window can also be made of sapphire, glass, or other transparent materials that would withstand the elevated temperatures. The system could operate without the susceptor or window, as some other wafer support could be provided (e.g., the support could be pins). The susceptor may be made of other metals than aluminum, such as MONEL, remembering that it is important to keep the thermal mass low, so a thickness of about 1/16" is appropriate. The thermocouple(s) could be located elsewhere in the system. See Table 1 for other possible alternates.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus for making electrical tests of components on a semiconductor wafer, comprising;
    a) a wafer support;
    b) one or more rapid thermal processing illuminators, mounted to illuminate said wafer support, said wafer, or both; and
    c) two or more test probe needles, each making an electrical contact to at least a component on said wafer, to allow the performance of electrical measurements of said component while the wafer is rapidly heated or cooled.

2. The apparatus of claim 1 and further comprising a thermocouple located in said wafer support.

3. The apparatus of claim 1 and further comprising a probe station cover, placed over said wafer and said wafer support.

4. The apparatus of claim 1 wherein said wafer support is comprised of a ring with an opening in the center, whereby the ring braces the edges of the wafer.

5. The apparatus of claim 1 wherein said wafer support is comprised of a ring with the center portion of said ring comprised of a transparent material.

6. The apparatus of claim 1 wherein said wafer support consists of a transparent window that allows radiation to emanate through the window and reach said wafer.

7. The apparatus of claim 1 wherein said wafer support is comprised of a thermally conductive material.

8. An apparatus for making electrical tests of components on a semiconductor wafer, comprising;
    a) a wafer support for said wafer, said wafer support comprising a low-thermal mass, thermally conductive susceptor;
    b) a transparent window that allows radiation to emanate through said window and reach said wafer, mounted under said susceptor;
    c) one or more rapid thermal processing illuminators, mounted under said window;
    d) and two or more test probe needles, each making an electrical contact to at least a component on said wafer, to allow the performance of electrical measurements of said component while the wafer is rapidly heated or cooled.

9. The apparatus of claim 8 and further comprising a thermocouple located near said wafer.

10. The apparatus of claim 8 and further comprising a probe station cover, placed over said wafer, susceptor and window.

11. The apparatus of claim 8 wherein said wafer is substantially thermally insulated from said window.

12. A method for electrically testing components on a semiconductor wafer while rapidly changing the temperature of said wafer, comprising the steps of;
    a) mounting said wafer on a wafer support;
    b) directly or indirectly heating said wafer with radiation from one or more rapid thermal processing illuminators;
    c) contacting said components on said wafer with two or more test probe needles and performing electrical measurements of said components on said wafer, while said wafer is rapidly heated or cooled, whereby such measurements are made without a large thermal mass of material in thermal contact with said wafer.

13. The method of claim 12 and further comprising the step of placing a thermocouple near said wafer.

14. The method of claim 12 and further comprising the step of covering said wafer and said wafer support with a probe station cover.

15. The method of claim 12 where said radiation from said illuminators directly heats a thermally conductive susceptor, whereby a low-thermal mass susceptor heats said wafer and the radiation indirectly heats the wafer.

16. The method of claim 12, further comprising the step of applying an electrical signal through said test probe needles to at least one component on said wafer.

17. The method of claim 16, further comprising the step of taking measurements of electrical signals through said test probe needles of at least one component on said wafer.

* * * * *